(12) United States Patent
Caveney et al.

(10) Patent No.: US 7,578,649 B2
(45) Date of Patent: Aug. 25, 2009

(54) DUAL ARM SUBSTRATE TRANSPORT APPARATUS

(75) Inventors: Robert T. Caveney, Windham, NH (US); Todd Solomon, Discovery Bay, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/159,726

(22) Filed: May 29, 2002

(65) Prior Publication Data

US 2003/0223853 A1 Dec. 4, 2003

(51) Int. Cl.
*B25J 18/04* (2006.01)

(52) U.S. Cl. .............. 414/744.5; 414/744.1; 414/744.6; 414/941; 901/15

(58) Field of Classification Search .............. 414/744.5, 414/744.1, 744.3, 744.4, 744.6, 936, 941, 414/222.09, 222.12, 226.01, 226.04, 744.65; 901/8, 15

See application file for complete search history.

(56) References Cited

U.S. PATENT DOCUMENTS

| | | | |
|---|---|---|---|
| 4,715,921 A | 12/1987 | Maher et al. ................. | 156/345 |
| 5,083,896 A | 1/1992 | Uehara et al. ............. | 414/744.5 |
| 5,512,320 A | 4/1996 | Turner et al. ................. | 427/255 |
| 5,566,436 A * | 10/1996 | Hirata ..................... | 414/744.5 |
| 5,577,879 A | 11/1996 | Eastman et al. ............. | 414/44.5 |
| 5,584,647 A | 12/1996 | Uehara et al. ............. | 414/744.5 |
| 5,720,590 A | 2/1998 | Hofmeister ................. | 414/44.2 |
| 5,765,983 A | 6/1998 | Caveney et al. ............. | 414/217 |
| 5,944,476 A | 8/1999 | Bacchi et al. ................. | 414/783 |
| 6,002,840 A | 12/1999 | Hofmeister ................... | 395/80 |
| 6,102,649 A | 8/2000 | Ogawa et al. .............. | 414/44.5 |
| 6,109,860 A | 8/2000 | Ogawa et al. .............. | 414/44.5 |
| 6,234,738 B1 * | 5/2001 | Kimata et al. ............. | 414/744.3 |
| 6,267,549 B1 * | 7/2001 | Brown et al. ............. | 414/744.5 |
| 6,481,956 B1 * | 11/2002 | Hofmeister ................. | 414/806 |
| 6,499,936 B2 * | 12/2002 | Ishigame ................. | 414/744.5 |
| 6,669,434 B2 * | 12/2003 | Namba et al. ............. | 414/744.5 |
| 6,752,584 B2 * | 6/2004 | Woodruff et al. ......... | 414/744.5 |

FOREIGN PATENT DOCUMENTS

JP 11-284049 10/1999

* cited by examiner

*Primary Examiner*—Michael S Lowe
(74) *Attorney, Agent, or Firm*—Perman & Green, LLP; Richard Pickreign

(57) ABSTRACT

A substrate transport apparatus comprising a drive section, an upper arm, a first forearm, and a second forearm. The upper arm is rotatably connected to the drive section at a first end of the upper arm. The upper arm is rotatably connected to the drive section for rotating the upper arm about an axis of rotation of the drive section. The first forearm is pivotably connected to the upper arm for pivoting relative to the upper arm. The first forearm has a first end effector depending therefrom. The second forearm is pivotably connected to the upper arm for pivoting relative to the upper arm. The second forearm has a second end effector depending therefrom.

19 Claims, 13 Drawing Sheets

US 7,578,649 B2

DUAL ARM SUBSTRATE TRANSPORT APPARATUS

BACKGROUND OF THE INVENTION

1. Field of the Invention

The present invention relates to a substrate transport apparatus and, more particularly, to a substrate transport apparatus having dual arms.

2. Prior Art

U.S. Pat. No. 5,720,590 discloses an articulated arm transfer device having a drive section with coaxial drive shafts, magnetic driving stators stationarily connected to a frame, and magnetic driven rotors on the shafts. U.S. Pat. Nos. 5,577,879 and 5,765,983 disclose scara arms. Non-coaxial side-by-side dual scara arms are offered for sale by three Japanese companies; the UTW and UTV series of robots by MECS, the RR series of robots by RORZE; and the LTHR, STHR, SPR series of robots by JEL.

SUMMARY OF THE INVENTION

In accordance with a first embodiment of the present invention, a substrate transport apparatus is provided. The substrate apparatus comprises a drive section, an upper arm, a first forearm, and a second forearm. The upper arm is rotatably connected to the drive section at a first end of the upper arm for rotating the upper arm about an axis of rotation of the drive section. The first forearm is pivotably connected to the upper arm for pivoting relative to the upper arm. The first forearm has a first end effector depending therefrom. The second forearm is pivotably connected to the upper arm for pivoting relative to the upper arm. The second forearm has a second end effector depending therefrom.

In accordance with a second embodiment of the present invention, a substrate transport apparatus is provided. The substrate transport apparatus comprises a drive section, and a scara arm. The scara arm is rotatably connected at a shoulder joint to the drive section for rotating the scara arm about an axis of rotation at the shoulder joint of the scara arm. The scara arm has a number of independently movable end effectors. The scara arm is capable of extending and retracting for extending and retracting the end effectors relative to the shoulder of the scara arm. The scara arm has a first extended position wherein a first end effector of the number of end effectors of the scara arm is extended.

In accordance with a method of the present invention, a method for transporting substrates with a substrate transport apparatus is provided. The method comprises the steps of providing the substrate transport apparatus with a scara arm including an upper arm, and two forearms depending from the upper arm, rotating the upper arm, and optionally rotating relative to the upper arm a first forearm of the two forearms. Each of the forearms has an end effector for holding a substrate thereon. Each forearm is independently rotatable relative to the upper arm. The upper arm is rotated about an axis of rotation at a shoulder of the scara arm. The first forearm of the two forearms is rotated relative to the upper arm for displacing radially a substrate on the end effector of the first forearm relative to the shoulder of the scara arm. A second forearm of the two forearms is optionally rotated relative to the upper arm for displacing radially a substrate on the end effector of the second forearm relative to the shoulder of the scara arm.

BRIEF DESCRIPTION OF THE DRAWINGS

The foregoing aspects and other features of the present invention are explained in the following description, taken in connection with the accompanying drawings, wherein.

DETAILED DESCRIPTION OF THE EMBODIMENTS

Figure 1:
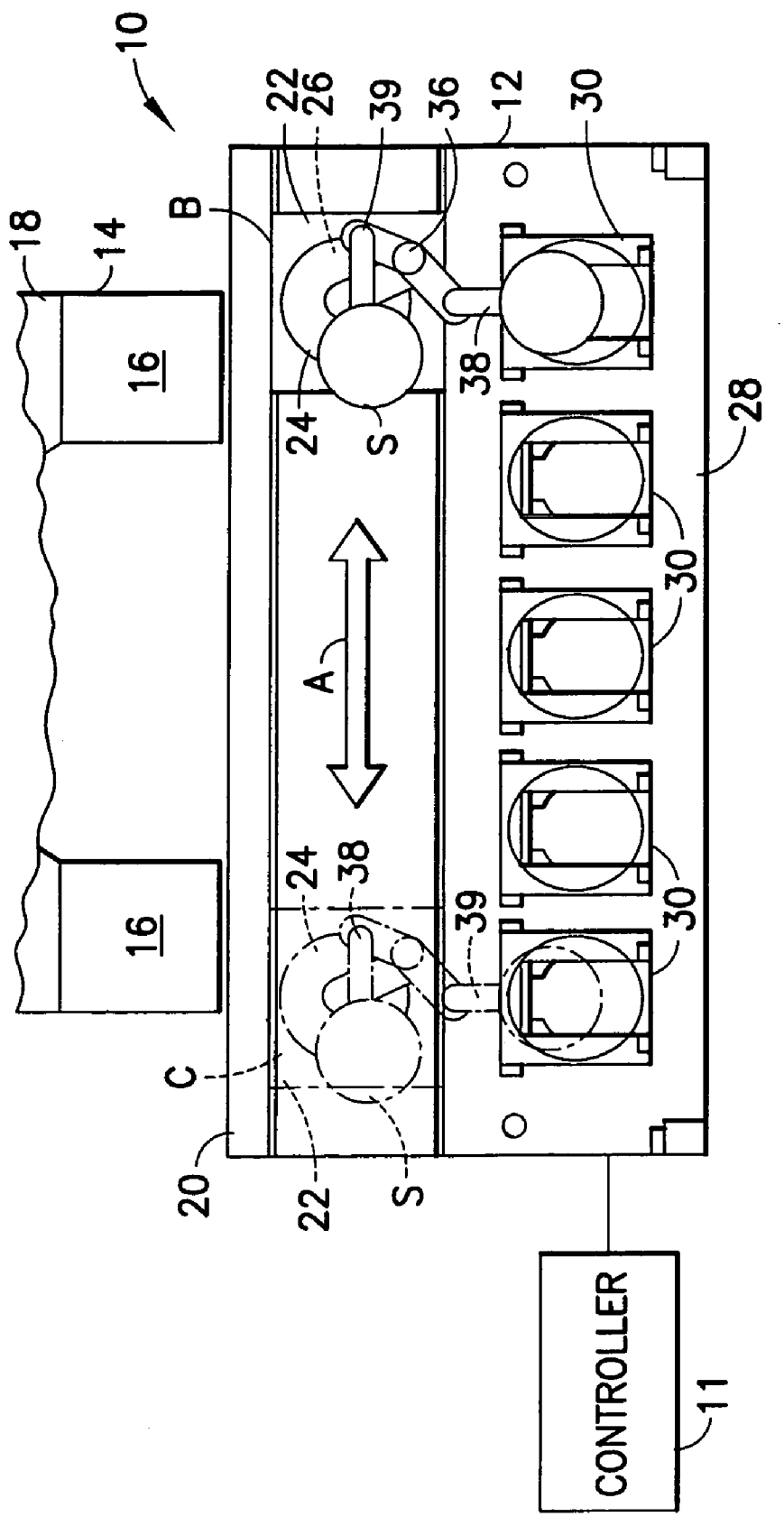
FIG. 1 is a schematic top plan view of a portion of a substrate processing system incorporating features of the present invention.

Referring to FIG. 1, there is shown a schematic top plan view of a substrate processing system 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The substrate processing system 10 generally comprises a substrate transport apparatus 12 and a substrate processing apparatus 14. The substrate processing apparatus 14 has load locks 16 connected to the transport apparatus 12, processing chambers (not shown) connected to a main chamber 18, and a substrate transport robot (not shown). Numerous different types of substrate processing apparatus are known in the prior art, such as disclosed in U.S. Pat. Nos. 5,765,983; 5,512,320 and 4,715,921 which are incorporated by reference herein in their entireties. However, any suitable type of substrate processing apparatus could be provided.

In this embodiment the substrate transport apparatus 12 generally comprises a frame 20, a car 22, a robot 24, a car drive 26 for moving the car along the frame 20, and means 28 for removably holding substrate cassettes 30. The apparatus 12 is used to remove substrates from the cassettes 30 and insert them into the substrate processing device 14 at the load locks 16. Once the substrate processing device 14 is finished processing a substrate, the apparatus 12 is used to return the substrate from the load locks 16 back to one of the cassettes 30. An operator can remove a cassette 30 after it has been filled with processed substrates and insert a new cassette of unprocessed substrates in its place. The apparatus 12 can be adapted to hold any suitable member of cassettes 30. The apparatus operates in atmospheric pressure, but could be used in other pressure situations, such as in a vacuum as will be further described below. The transport apparatus 12 can have an aligner (not shown) to align the substrates. In an alternate embodiment, the apparatus 12 need not have an aligner, such as when the aligner is located in the substrate processing device 14. The apparatus 12 might also have a substrate buffer. The apparatus 12 is connected to a computer controller 11 which controls movement of the car 22 relative to the frame 20 and controls movement of the robot 24.

Figure 2:
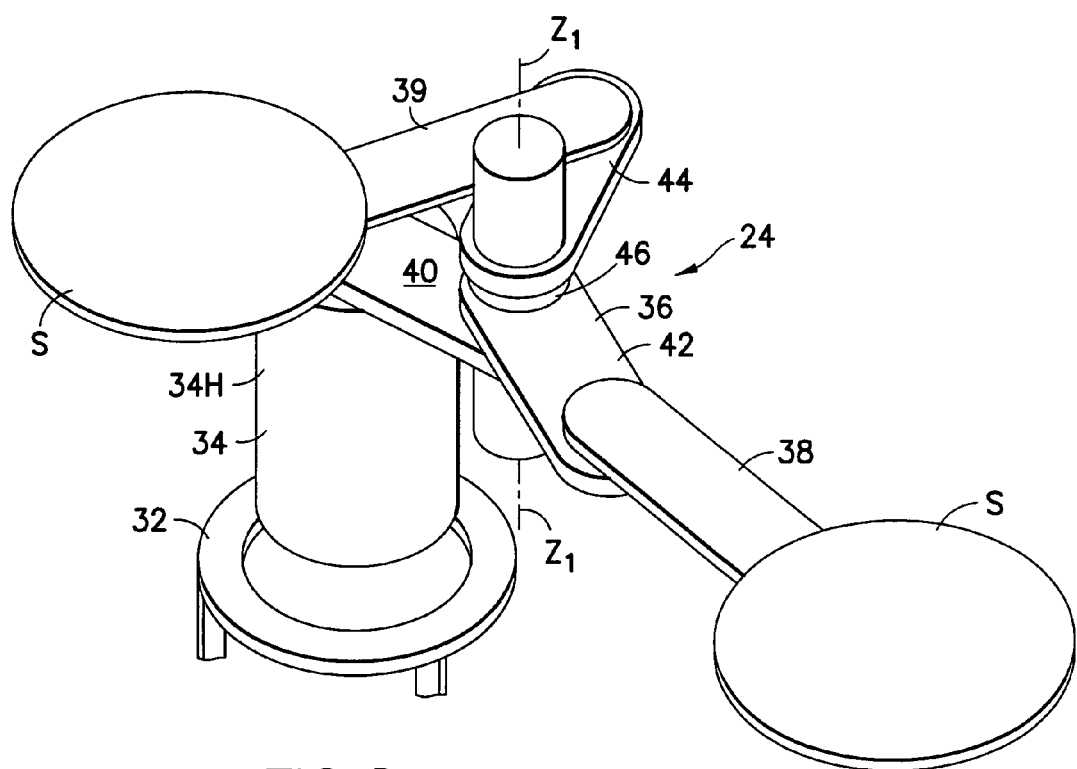
FIG. 2 is a perspective view of a substrate transport apparatus used in the substrate processing apparatus shown in FIG. 1.

Referring also to FIG. 2 the robot 24 generally comprises a frame 32, a rotational drive 34, a movable arm assembly 36, and two end effectors 38, 39. The end effectors 38, 39 are adapted to hold substrates S thereon. The end effectors 38, 39 are attached to ends of the arm assembly 36. The drive 34 is adapted to move the arm assembly 36 to thereby move the end effectors 38, 39 into and out of the cassettes 30 and the load locks 16. The drive 34 is mounted to the car 22 by the frame 32. The frame 32 supports the robot 24 on the car 22, for example, as a drop-in assembly and, provides a mounting frame for electronics control circuit boards (not shown). The car 22 is movably mounted to the frame 20. The car 22 can move along the frame 20 as indicated by arrow A between position B and position C. A similar substrate transport apparatus is described in U.S. patent application Ser. No. 08/891,234 which is incorporated by reference herein in its entirety. In alternate embodiments, features of the present invention could be used in any suitable type of substrate transporting robot including the robot inside the substrate processing apparatus 14 and other types of substrate transport apparatus. In alternate embodiments, any suitable type of track system or system for movably supporting the car along the frame could be used. The robot 24 could also be connected to the car in any suitable fashion. In another alternate embodiment, the robot relocating mechanism of the movable car 22 need not be provided, such as when the drive 34 remains at one location only on the frame 20. A vertical drive motor (not shown) may be connected to the bottom of the frame 32, in a manner similar for example to that described in U.S. patent application Ser. No. 09/228,268 which is incorporated by reference herein in its entirety, to vertically move the robot 24 up and down in the frame 32. However, in an alternate embodiment any suitable type of vertical movement system could be provided or no vertical movement system need be provided. The frame 32 and robot 24 could use a vertical movement cage and track system such as disclosed in U.S. patent application Ser. No. 08/873,693 which is incorporated by reference herein in its entirety.

Still referring to FIGS. 1 and 2, the movable arm assembly 36 is a scara arm assembly which comprises an upper arm link 40, a first forearm link 42, and a second forearm link 44. The upper arm link 40 is pivotably connected to drive section 34 at the shoulder joint of the arm assembly 36. The first forearm link 42 is pivotably connected to the upper arm link 40 at the elbow joint 46 of the arm assembly 36. The second forearm link 44 is also pivotably connected to the upper arm link at the elbow joint 46 of the arm assembly. End effector 38 is pivotably connected to the first forearm link 42. End effector 39 is pivotably connected to the second forearm link 44. In this embodiment, the upper arm link and both forearm links 40, 42, 44 are substantially of equal length. In alternate embodiments, the length of the movable arm assembly links may vary as desired.

Figure 3:
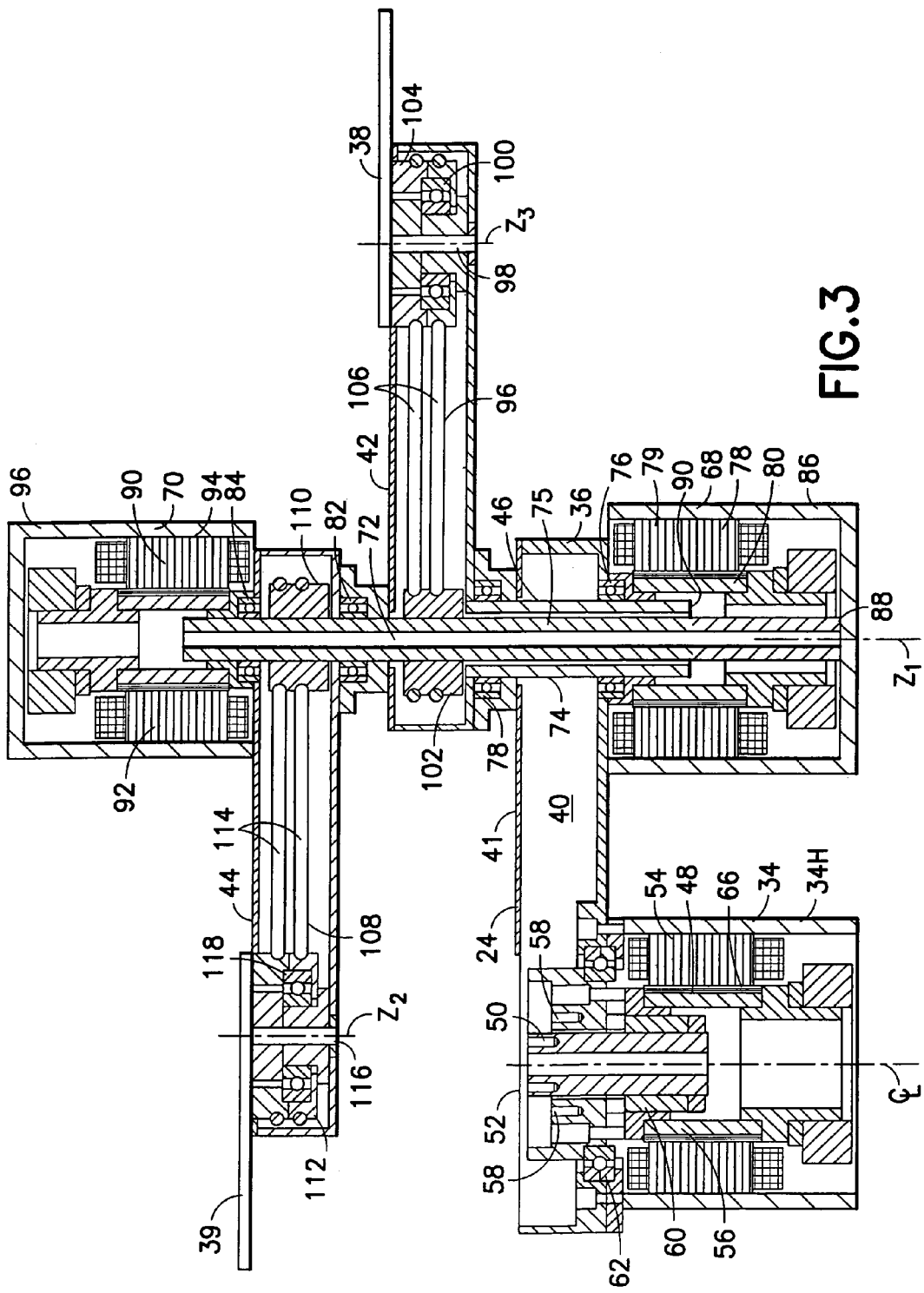
FIG. 3 is a cross-sectional view of a movable arm assembly and drive section of the substrate transport apparatus in FIG. 2 in accordance with a first preferred embodiment of the present invention.

Referring now to FIG. 3, there is shown a cross-sectional view of the robot arm assembly 36 and drive section 34. Drive section 34 comprises a housing 34H and a rotational motor located in the housing. In alternate embodiments, the drive section may have more than one rotational motor. The motor 48 rotates shaft 50 about an axis which is generally coincident to the center line CL of the shoulder joint 52 of arm assembly 36 (see FIG. 3). The shaft 50 is fixedly held by suitable fasteners such as for example machine or cap screws to the upper arm link 40. Thus, the shaft 50 and the upper arm link 40 rotate substantially as a unit. The shaft 50 also has a portion 60 which is rotatably captured in suitable bearings or bushings 62 mounted to the drive section housing 34H. A stop washer (not shown) may be mounted on the shaft 50 to engage stops on the housing 34H and to prevent inadvertent vertical motion between shaft 50 and drive section 34. The motor 48 preferably includes a stator 54, and a rotor 56. The stator 54 may include electromagnetic coils or windings fixedly mounted to the housing 34H which is mounted to frame 32 (see FIG. 2). The rotor 56 is mounted to portion 60 of shaft 50. The rotor 56 may include permanent magnets or a magnetic induction rotor which does not have permanent magnets. In alternate embodiments, the rotational motor for rotating the shaft in the drive section may be of any other suitable type such as a stepper motor. Sleeve 66 may be installed between the stator 54 and rotor 56 to allow the robot 24 to be usable in a vacuum environment with the drive shaft 50 being located in the vacuum environment and the stator 54 being located outside the vacuum environment. The windings of the stator 54 are configured to rotate the shaft 50 in the clockwise or counter-clockwise directions as desired about the centerline CL of the shoulder joint 52.

As seen in FIG. 3, the upper arm link 40 has a coaxial shaft assembly 75 connecting the forearm links 42, 44 to the upper arm link 40 at the elbow joint 46. The forearm links 42, 44 are located above the upper arm link 40, with the first forearm link 42 located between the second forearm 44 and the upper arm link 40. The coaxial shaft assembly 75 includes an outer shaft assembly 74 and an inner shaft 72. The outer shaft 74 is fixedly mounted to the first forearm 42 to rotate with the forearm as a unit about axis of rotation Z1 at the elbow 46 of the arm assembly 36. The outer shaft 74 is rotatably held to the upper arm 40 with suitable bearing or bushings 78, 76, so that the shaft may rotate relative to the upper arm link. Bearing 78 may also be a suitable thrust bearing to vertically support the first forearm link 42 from the upper arm link 40. In this embodiment, the robot 24 has two arm borne drive sections 68, 70. The lower drive section 68 is mounted to the upper arm link 40 to drive the outer shaft 74 connecting the first forearm link 42 to the upper arm link 40. The upper drive section 70 is mounted on the second forearm link to drive the second forearm link 44 about inner shaft 72 as will be described in greater detail below. In alternate embodiments, the arm assembly may have one arm borne two-axis drive section capable of independently driving the inner and outer shafts of the coaxial shaft assembly connecting the forearm links to the upper arm link. The lower drive section 68 is substantially similar to the drive section 34. The lower drive section may have a rotational motor 79 with a stator 78 and a rotor 80. The stator 78, which may comprise suitable electromagnetic windings, is fixedly mounted by appropriate structure to the upper arm link 40. The rotor 80, which may comprise permanent magnets or an electro-inductive rotor, is mounted onto the outer shaft 74. The windings on the stator 78 are configured to rotate the outer shaft 74 about axis Z1 in both a clockwise or counter-clockwise rotation relative to the upper arm link 40.

The inner shaft 72 which connects the second forearm link 44 to the upper arm link 40 at elbow 46, is rotatably held by suitable bearings 82, 84 to the forearm link 44. Bearing 82 is preferably a thrust bearing which vertically supports the second forearm link from the first forearm link 42. The first and second forearm links 42, 44 are then vertically supported from the upper arm link by thrust bearing 78 as previously described. The lower end 88 of the inner shaft 72 is fixedly mounted to the upper arm link 40. In the shown embodiment, the inner shaft 72 extends out of the bottom 90 of the outer shaft 74 and is connected at the bottom 88 to structure 86 depending from the upper arm link 40. Thus, in this embodiment, the inner shaft 72 is stationary relative to the upper arm link 40, and the second forearm link 44 can rotate about axis Z1 relative to the inner shaft 72. As noted previously, the upper arm borne drive section 70 is mounted on the second forearm link 44 as shown in FIG. 3. The upper drive section 70 has a rotational motor 90 which rotates the forearm link 44 on shaft 72. The rotational motor 90 of the upper drive section 70 is preferably substantially similar to the motors 38, 79 in drive sections 34, 68 of the robot 24. The motor 90 has a stator 92 comprising suitable electro-magnetic windings, and a rotor 94 which may have permanent magnets or magnetic induction coil. However, in this case, the stator 92 is mated to the inner shaft 72 which is fixedly attached to the upper arm link 40, and the rotor 94 is mounted to structure 96, such as the housing of the upper drive section 70, depending from the second forearm link 44. In alternate embodiments, the upper drive section mounted on the second forearm link may include any other suitable rotational motor for rotating the second forearm link about axis Z1 relative to the upper arm link of the robot.

Figure 4A:
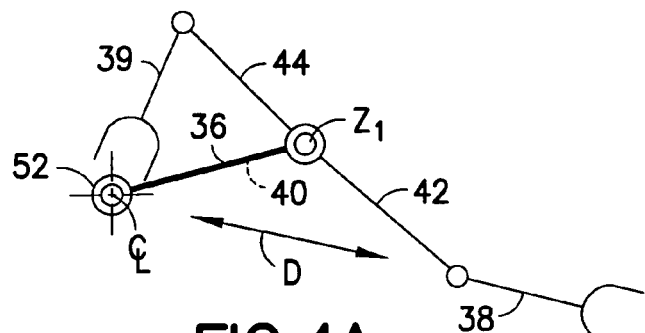
FIGS. 4A-4D are schematic plan views respectively showing four positions of the substrate transport apparatus in FIG. 2.

As can be seen in FIG. 3, end effector 38 is fixedly mounted on support shaft 98. Support shaft 98 is rotatably mounted by suitable bearings 100 to the first forearm link 42 thereby allowing the first forearm link 42 and end effector 38 to rotate relative to each other about axis or rotation 73. As shown, forearm link 42 is a hollow tube having any suitable cross-section. The forearm link 42 houses a synchronizer 96 which connects shaft 98 to end effector support stationary inner shaft 72. In alternative embodiments, the synchronizer between the end effector support and inner shaft may be located external to the forearm link. The synchronizer 96 preferably includes drum 102 connected to idler pulley 104 using cables or belts 106. The drum 102 is fixedly connected to inner shaft 72 by splines, staking, or force fitting the drum over the shaft, or by any other suitable means. The idler pulley 104 is fixedly mounted to the support shaft 98 on the end effector 38 such as for example by force fitting the pulley 104 over shaft 98. The diameter ratio between idler pulley 104 and drum 102 is preferably about 2 to 1. Belts 106, connecting the drum 102 and idler pulley may be made of plastic, reinforced rubber or any other suitable material. Belt 106 is disposed in a general loop configuration around the drum 102 and pulley 104. The belt 106 may be pretensioned as desired so that the belt is in no-slip contact with the drum and pulley. In alternate embodiments, the drum pulley and belt may be provided with meshing teeth to maintain a no-slip condition between the belt and drum, and belt and pulley. In alternate embodiments, the synchronizing mechanism connecting the end effector to the inner shaft may be of any other suitable type such as for example the inner shaft having a crank member connected by a link to the end effector. The synchronizer 96 synchronizes the rotation of the end effector 38 about axis Z3 with the rotation of the first forearm about axis Z1 so that the end effector 38 is moved along a substantially straight line as shown in FIG. 4A. For example, when the lower drive section 68 rotates the outer drive shaft 74, thereby rotating the first forearm link 42 about axis Z1, drum 102 remains fixed with respect to axle Z1. The relative rotation between drum 102 and forearm 42 causes belts 106 to rotate idler pulley 104, and hence, rotate end effector 38 about axis Z3. Belts 106, which is noted above, have a loop configuration, cause the end effector 38 to counter-rotate relative to the rotation of the first forearm link 42. Accordingly, if shaft 74 and forearm link 42 are rotated clockwise, the end effector 38 is rotated counter-clockwise and vice versa (see FIG. 4A). Also, the 2 to 1 diameter ratio between the idler 104 and drum 102 causes the end effector 38 to undergo substantially about half the rotation of the forearm link 42. Thus, if for example the forearm link 42 is rotated 90° about axis Z1 then end effector 38 is rotated about 45° about axis Z3. This results in the end effector 38 remaining substantially aligned along a radial axis extending through shoulder joint 52 of arm assembly 36 as shown in FIG. 4A.

Still referring to FIG. 3, the upper drive section 70 rotates the end effector 39 in combination with the synchronizing mechanism 108 located inside the second forearm link 44. As seen in FIG. 3, the second forearm link 44 is a hollow member substantially similar to the first forearm link 42. In this embodiment, the synchronizing mechanism comprises a drum wheel 110, a pulley wheel 112, and cables or belts 114 connecting the drum and pulley wheel. In alternate embodiments, the synchronizing mechanism between the end effector and upper drive section, may have any other suitable configuration. The drum 110, is fixedly mounted on the stationary inner shaft 72 by any suitable means such as using keys, splines, or staking the wheel on the shaft. The pulley wheel 112 is fixedly attached to support shaft 116 pivotably connecting end effector 39 to the second forearm link 44. The support shaft 116 is fixedly mounted on the end effector 39 and rotatably mounted with suitable bearings 118 to second forearm link 44 which allows the shaft, pulley wheel 112 and the end effector 39 to rotate about axis Z2 relative to the forearm link 44. The diameter ratio between pulley wheels 112 and 110 is about 2 to 1, similar to the ratio of synchronizing mechanism 96. Belts 114 are configured to have a general loop shape (not shown). The synchronizing mechanism 108 operates to rotate the end effector about axis Z2 and to maintain the end effector 39 traveling along a straight line when the upper drive section 70 rotates the second forearm link 44 about axis Z1 (see FIG. 4B). By way of example, when the upper drive section 70 rotates the second forearm link 44 (e.g. clockwise) about axis Z1, the belts 114 around stationary pulley wheel 110 act to counter-rotate (e.g. counter-clockwise) wheel 112, and hence end effector 39 about axis Z2 relative to the forearm link 44. The 2 to 1 ratio between wheels 112 and 110 causes the end effector 39 to undergo about half the angular rotation in comparison to the rotation of the second forearm link 44. Hence, if the second forearm link 44 is rotated clockwise 90° about axis Z1 then end effector 39 is rotated counter-clockwise 45° about axis Z2 by the synchronizing mechanism 108, which thus maintains the end effector aligned with the shoulder 52 of arm assembly 36 (see FIG. 4B).

Figure 4B:
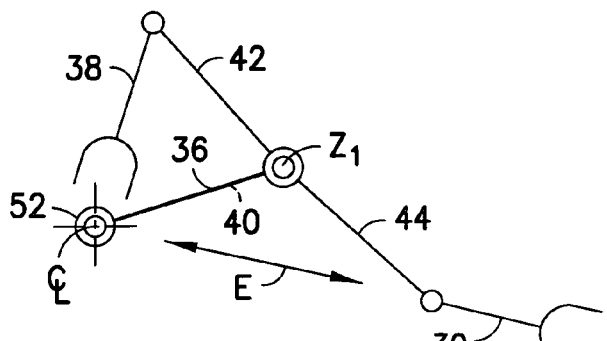
Figure 4C:
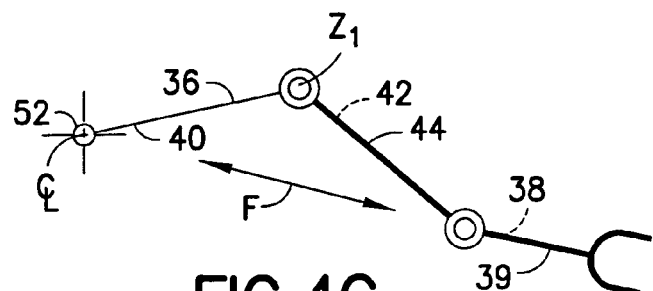
Figure 4D:
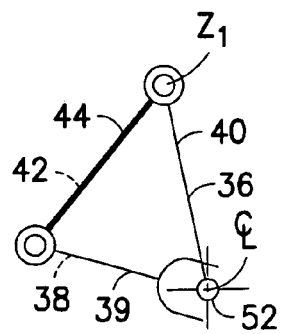

Referring now to FIGS. 4A-4D, the movable arm assembly 36 is shown in four different positions. In FIG. 4D the movable arm assembly 36 is in a retracted position with both end effectors 38, 39 being retracted. In FIG. 4A, the movable arm assembly 36 is in a first extended position with one end effector 38 extended, and the other end effector 39 being retracted. In FIG. 4B, the movable arm assembly is in a second extended position wherein, converse to the first position in FIG. 4A, end effector 39 is extended and end effector 38 is retracted. In FIG. 4C, the arm 36 is in a third extended position where both end effectors 38, 39 are extended. The arm 36 is extended between the retracted position in FIG. 4D and the first extended position in FIG. 4A, preferably, by rotating the upper arm link 40 at the shoulder 52 with drive section 34, and counter-rotating the first forearm link 42 about axis Z1 with lower drive unit 68. The controller 11 (see FIG. 1) may operate the drive sections 68, 34 to rotate the forearm link 42 at about twice the rate of rotation of the upper arm link 40. By way of example, controller 11 operates drive section 34 (see FIG. 3) to rotate the upper arm link 40 clockwise at shoulder 52 and operates drive section 68 to rotate forearm link 42 counter-clockwise about axis Z1 at twice the rate of rotation of the upper arm link 40. Thus, the end effector 38 is moved along a substantially straight line (as indicated by arrow D in FIG. 4A) when the arm assembly 36 is extended in the above manner. Drive section 20 in this embodiment may be stationary maintaining the forearm link 44 in the same position relative to the upper arm link 40. Retraction of the end effector 38, so that the arm assembly 36 is retracted to the position shown in FIG. 4D, is accomplished in a substantially reverse manner.

The arm assembly 36 is extended between the retracted position in FIG. 4D and the second extended position in FIG. 4B, for example, by rotating the upper arm link 40 at the shoulder 52 with drive section 34 and counter rotating the forearm link 44 about axis Z1 with upper drive section 70 when the upper arm link is rotated. The controller 11 may operate drive sections 34, 70 to rotate the forearm link 44 at about twice the rate of rotation of the upper arm link 40. For example, controller 11 operates drive section 34 to rotate the upper arm link 40 clockwise at shoulder 52 and operate drive section 70 to rotate the forearm link 44 counter-clockwise about axis Z1 at twice the rate of rotation of the upper arm link. During extension, the end effector 39 controlled by synchronizing mechanism 108 moves along a substantially straight line indicated by arrow E in FIG. 4B. In this case, forearm link 42 remains in the same position relative to the upper arm link 40. Retraction of end effector 39 from the position in FIG. 4B to the retracted position in FIG. 4D is accomplished in a substantially reverse manner.

To extend arm assembly 36 to the position shown in FIG. 4C, the arm may be extended first to either one of the positions shown in FIG. 4B,4C (i.e. extending one end effector 38, 39 at a time as previously described), and then independently rotating about axis Z1 the forearm link 44, 42 with the unextended end effector 38, 39 so that both end effectors 38, 39 are extended substantially as shown in FIG. 4C. Otherwise, the upper arm link 40, driven by drive section 34 and both forearm links 42, 44 independently rotated about axis Z1 respectively by drive section 68, 70, may be rotated at the same time so that both end effectors 38, 39 traverse along a substantially straight line indicated by arrow F in FIG. 4C. The arm assembly 36 of robot 24 may be moved by an operator between any one of the positions in FIGS. 4A-4D as described in order to independently transport two substrates S (see FIG. 1) one on each of the two independently movable end effectors 38, 39, between initial and final positions such as for example between the cassettes 30 and load locks 16.

Figure 5:
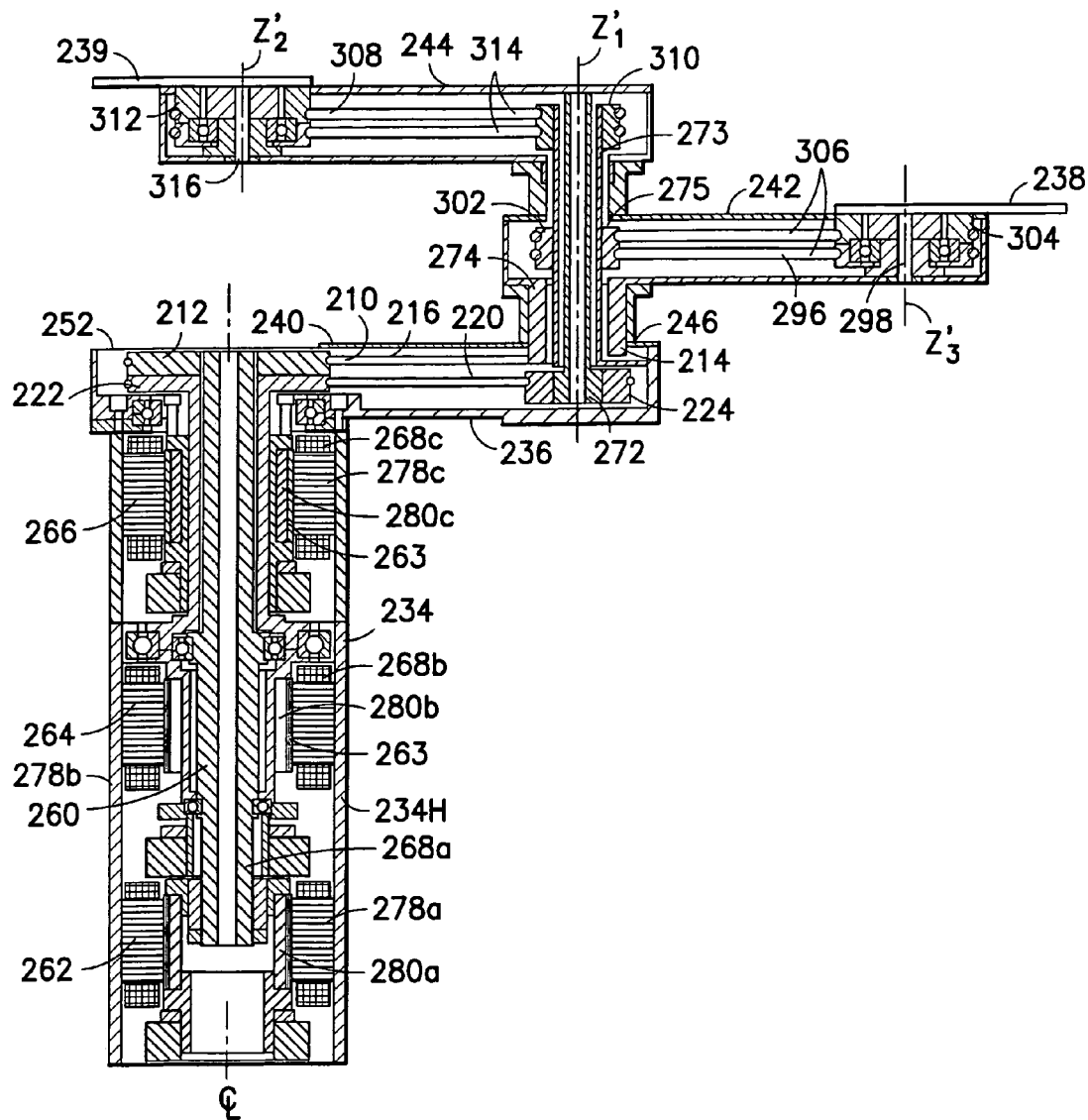
FIGS. 5-5A are respectively a partial cross-sectional view and a perspective view of a movable arm assembly and drive section of the substrate transport apparatus incorporating features in accordance with a second preferred embodiment of the present invention.
Figure 5A:
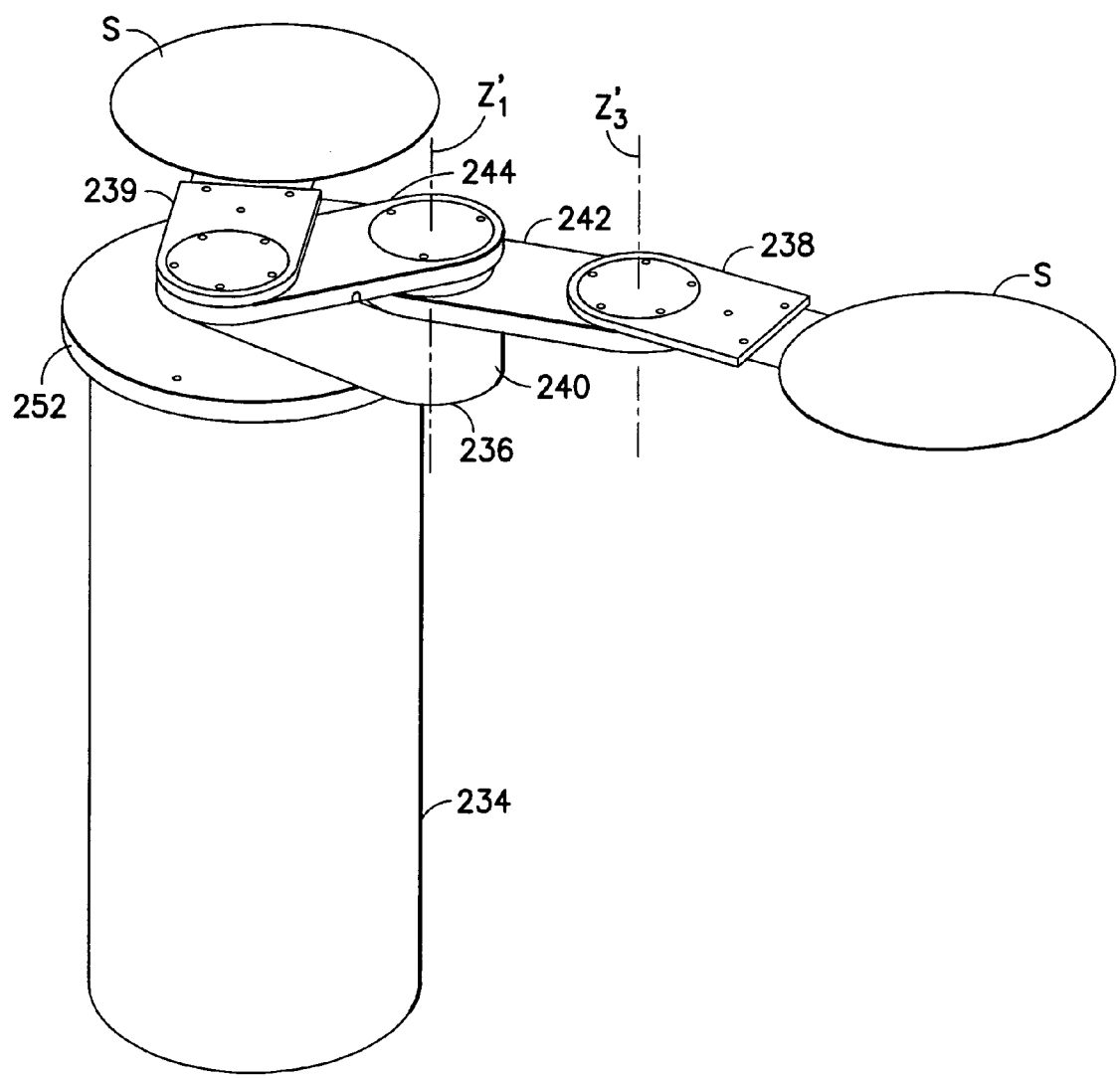

Referring now to FIG. 5, there is shown a cross-sectional view of a scara arm assembly 236 of the substrate transport apparatus in accordance with a second embodiment of the present invention. FIG. 5A shows a perspective view of the scara arm assembly 236. Except as described below, the scara arm assembly 236 shown in FIG. 5 is substantially similar to arm assembly 36 described above and shown in FIGS. 2-4D, with similar features having similar reference numbers. Scara arm assembly 236 comprises an upper arm link 240, a first forearm link 242, a second forearm link 244, and two end effectors 238, 239. The forearm links 242, 244 are pivotably connected by a coaxial shaft assembly 275 to the upper arm link 240 at elbow 246 of arm assembly 236. End effector 238 is pivotably connected by support shaft 298 to the first forearm link 242 and end effector 239 is pivotably connected by support shaft 316 to the second forearm link 244. The scara arm assembly 236 is rotatably connected at the shoulder 252 to drive section 234.

Drive section 234 may have an outer housing 234H which houses a co-axial shaft assembly 260, and three motors 262, 264, 266. In an alternate embodiment, the drive section could have more than three motors. The drive shaft assembly 260 has three drive shafts 268a, 268b, 268c. In an alternate embodiment more than three drive shafts could be provided. The first motor 262 comprises a stator 278a and a rotor 280a connected to the inner shaft 268a. The second motor 264 comprises a stator 278b and a rotor 280b connected to the middle shaft 268b. The third motor 266 comprises a stator 278c and rotor 280c connected to the outer shaft 268c. The three stators 278a, 278b, 278c are stationarily attached to the housing 234H at different vertical heights or locations along the housing. In this embodiment the first stator 278a is the bottom stator, the second stator 278b is the middle stator and the third stator 278c is the top stator. Each stator generally comprises an electromagnetic coil. The three shafts 268a, 268b, and 268c are arranged as coaxial shafts. The three rotors 280a, 280b, 280c are preferably comprised of permanent magnets, but may alternatively comprise a magnetic induction rotor which does not have permanent magnets. Sleeves 263 are located between the rotor 280 and the stators 278 to allow the robot 24 to be useable in a vacuum environment with the drive shaft assembly 260 being located in a vacuum environment and the stators 278 being located outside of the vacuum environment. However, the sleeves 263 need not be provided if the robot 24 (see FIG. 1) is only intended for use in an atmospheric environment.

The first shaft 268a is the inner shaft and extends from the bottom stator 278a. The inner shaft has the first rotor 280a aligned with the bottom stator 278a. The middle shaft 268b extends upward from the middle stator 278b. The middle shaft has the second rotor 280b aligned with the second stator 278b. The outer shaft 268c extends upward from the top stator 278c. The outer shaft has the third rotor 280c aligned with the upper stator 278c. Various bearings are provided about the shafts 268 and the housing 234H to allow each shaft to be independently rotatable relative to each other and the housing 234H. Each shaft 268 may be provided with a suitable position sensor to signal the controller 11 (see FIG. 1) of the rotational position of the shafts 268 relative to each other and/or relative to the housing 234H. Any suitable sensor could be used, such as optical or induction.

The outer shaft 268c is fixedly connected to the upper arm link 240 so that shaft and upper arm link rotate together as a unit. The middle shaft 268b is connected to a first transmission to 220 in the upper arm link 240, and the inner shaft 268a is connected to a second transmission 210 in the upper arm link as shown in FIG. 5. The first transmission 220 preferably comprises a drive pulley 222, an idler pulley 224 and drive cables or belts 226. The drive pulley 222 is fixedly mounted to the top of the middle shaft 268b and is connected by drive belt 226 to the idler pulley 224. The idler pulley 224 is fixedly mounted to the bottom of the inner shaft 272 of coaxial shaft assembly 275 connecting the forearm links to the upper arm link. The second transmission 210 in the upper arm link 240 preferably comprises a drive pulley 212, an idler pulley 214, and drive belt or cables 216. Drive pulley 212 is fixedly mounted to the top of inner shaft 268a of coaxial shaft assembly 260 in drive section 234. The idler pulley 214 is fixedly mounted to the bottom of outer shaft 274 of the coaxial shaft assembly 275 connecting the forearm links to the upper arm link. Drive belt 216 connects the drive pulley 212 to the idler pulley 214. The diameter ratio between the idler and the drive pulleys 214, 212 of the second transmission 210, and between the idler and drive pulleys 224, 222 of the first transmission 220 in this embodiment is about 1 to 1, though in alternate embodiments the ratio between the idler and drive pulleys may be as desired. The drive belts 216, 226 are configured to rotate the respective idler pulleys 214, 204 in the same direction as the corresponding drive pulley 212, 222 (e.g. clockwise rotation of drive pulleys 220, 222 causes clockwise rotation of idler pulley 214, 222).

The coaxial shaft assembly 275 connecting the forearm links 242, 244 to the upper arm link 240 is rotatably supported from the upper arm link by suitable bearings which allow the outer and inner shafts 274, 272 of the shaft assembly to rotate about axis Z1' relative to each other and to upper arm link 240. The outer shaft 274 of coaxial shaft assembly 275 is fixedly mounted to the first forearm link 242 so that the shaft and link rotate together as a unit about Z1'. The first forearm link 242 is rotated about axis Z1' when the idler pulley 214 of the second transmission 210 in the upper arm link is rotated by inner shaft 268a of drive section 234. Thus, the inner shaft 268a of drive section 234 is used to independently rotate forearm link 242 relative to the upper arm link 240. As shown in FIG. 5, the coaxial shaft assembly 275 also connected includes an intermediate shaft 273 by forearm synchronizing mechanism 296 to end effector 238 for rotating the end effector 238 depending from forearm link 242. Intermediate shaft 273 of the co-axial shaft assembly 275 is fixed to the upper arm link 240. Forearm synchronizer 296 may be located within the forearm link, and preferably comprises drum 302, idler pulley 304, and drive cables or belts 306. Drum 302 is fixedly mounted to the stationary intermediate coaxial shaft 273. Idler pulley 304 is fixedly mounted to shaft 298 pivotably connecting the end effector 238 to the forearm links 242. Drive belts 306 connect the drum 302 to the idler 304 and are preferably configured to have a general loop shape (not shown) so that rotation of the forearm link 242 about axis Z1' causes counter-rotation of the idler 304 about axis Z3'. In the preferred embodiment, drum 302 on intermediate shaft 273 has substantially the same diameter as idler pulley 214 at the bottom of shaft 274 thereby resulting in a diameter ratio of about 1:1. The diameter ratio between the idler pulley 304 and the drum 302 of synchronizer 296 is about 2:1. The aforementioned pulley diameter ratios of forearm synchronizer 296 and of the second transmission 210 (see FIG. 5) causes the end effector 238 to maintain a substantially straight line motion similar to that shown in FIG. 4A when the scara arm assembly 236 is extended and retracted.

The inner shaft 272 of coaxial shaft assembly 275 is fixedly mounted to the second forearm link 244 and the shaft and link thus rotate together as a unit about axis Z1'. The second forearm link is rotated about axis Z1' when idler pulley 224 of the first transmission 220 in the upper arm link 240 is rotated by middle shaft 268b of drive section 234. Hence the second forearm link 244, rotated by the middle shaft 268b, and the first forearm link 242, rotated by the inner shaft 268a, may be rotated independently of each other about a common axis Z1'. As seen in FIG. 5, the stationary intermediate shaft 273 is also connected to a synchronizing mechanism 308 for rotating end effector 239 depending from the second forearm link 244. Forearm synchronizing mechanism 308 is located in forearm link 244, and comprises drum 310, idler 312, and drive cables or belts 314. The driver 310 is fixedly mounted to the top of intermediate shaft 273. Idler 312 is fixedly mounted to shaft 316 which pivotably connects the end effector 239 to forearm link 244. Drive cables 314 connect the drum 310 to idler 312 and are preferably configured in a general loop shape (not shown), so that rotation of the forearm link 244 about axis Z1' causes counter-rotation idler 312 about axis Z2'. As shown on FIG. 5, the drum 310 at the top of intermediate shaft 273 has substantially the same diameter as idler pulley 224 at the bottom of inner shaft 272, thereby resulting in a diameter ratio of about 1:1. The diameter ratio between idler 312 and drum 310 of synchronizer 308 is preferably about 2:1. These ratios in combination with the reduction ratio of the first transmission 220 in the upper arm link 240 causes the end effector 239 to traverse in a substantially straight line similar to that shown in FIG. 4B when the scara arm 236 is extended or retracted.

Figure 6:
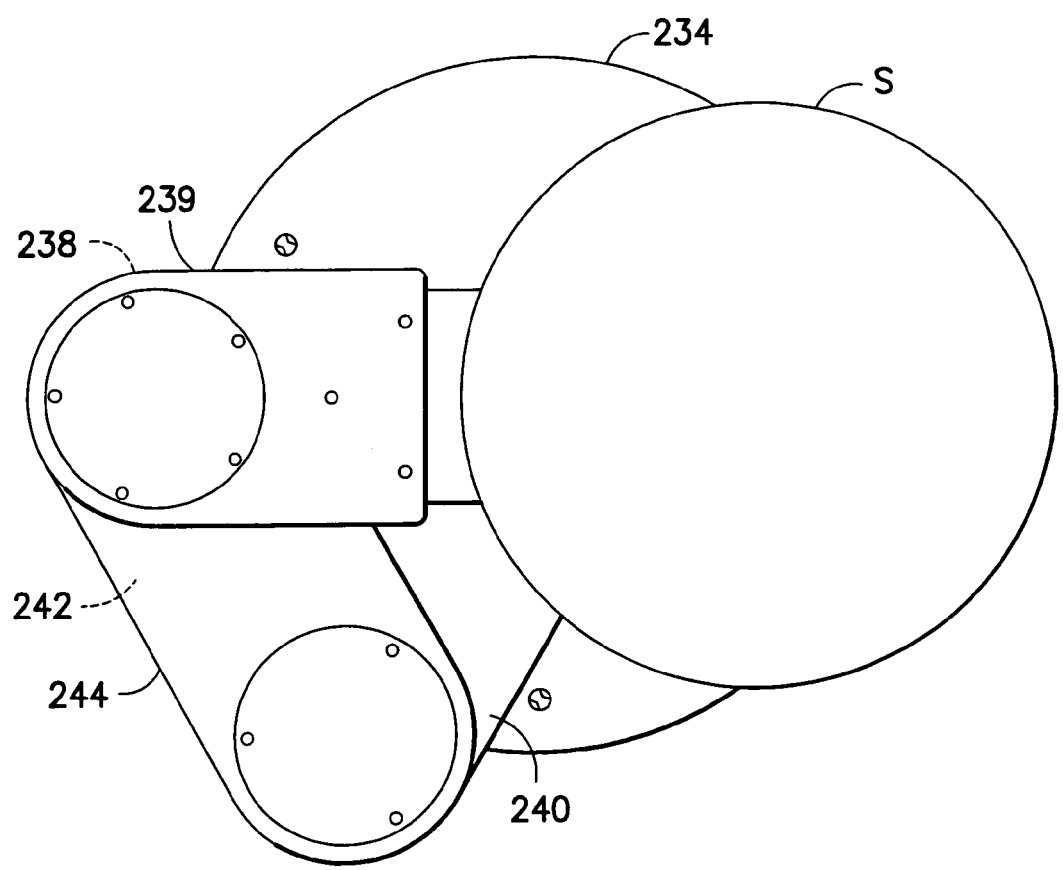
FIGS. 6-9 are schematic top plan views respectively showing four positions of the substrate transport apparatus in FIG. 5.
Figure 7:
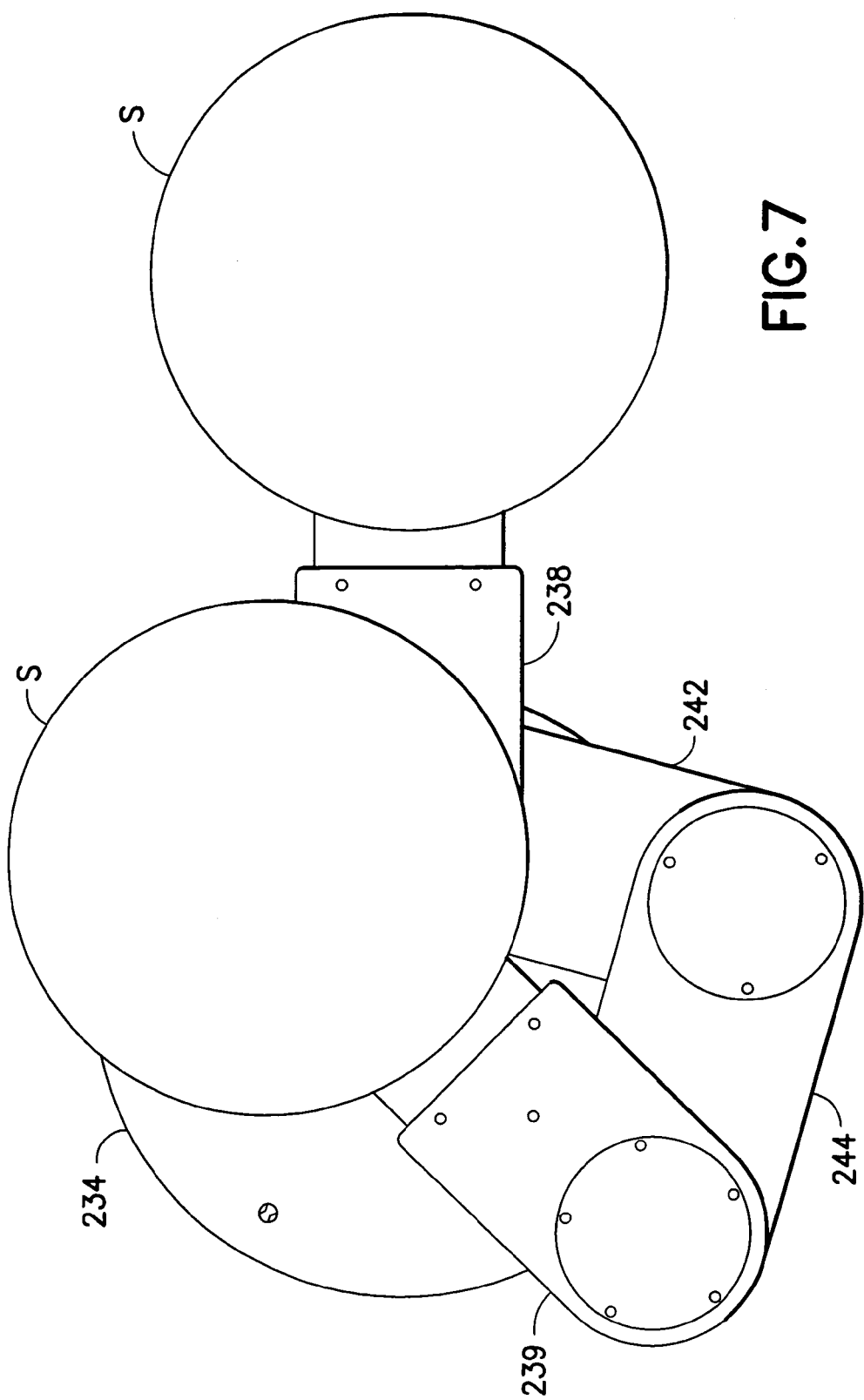
Figure 8:
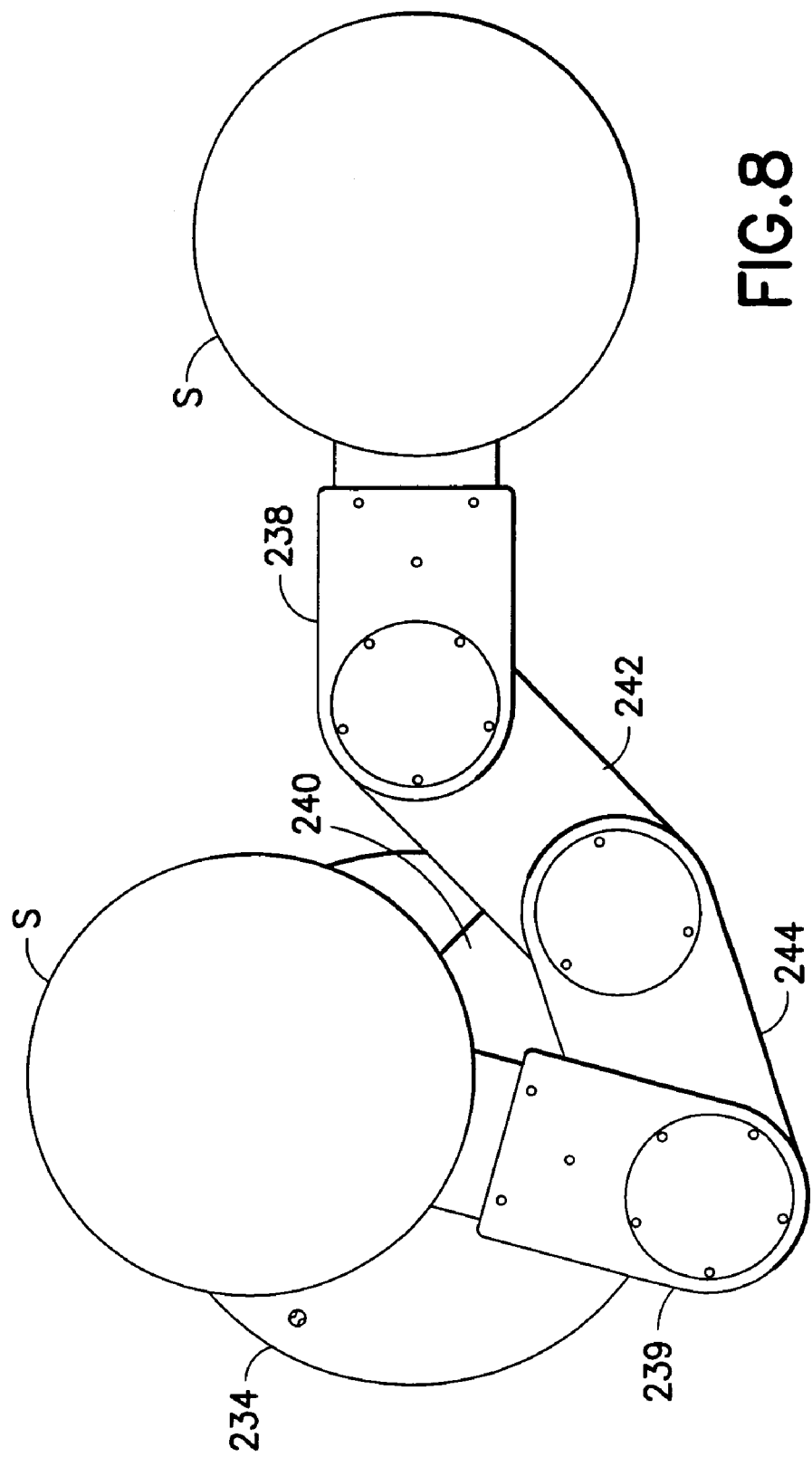
Figure 9:
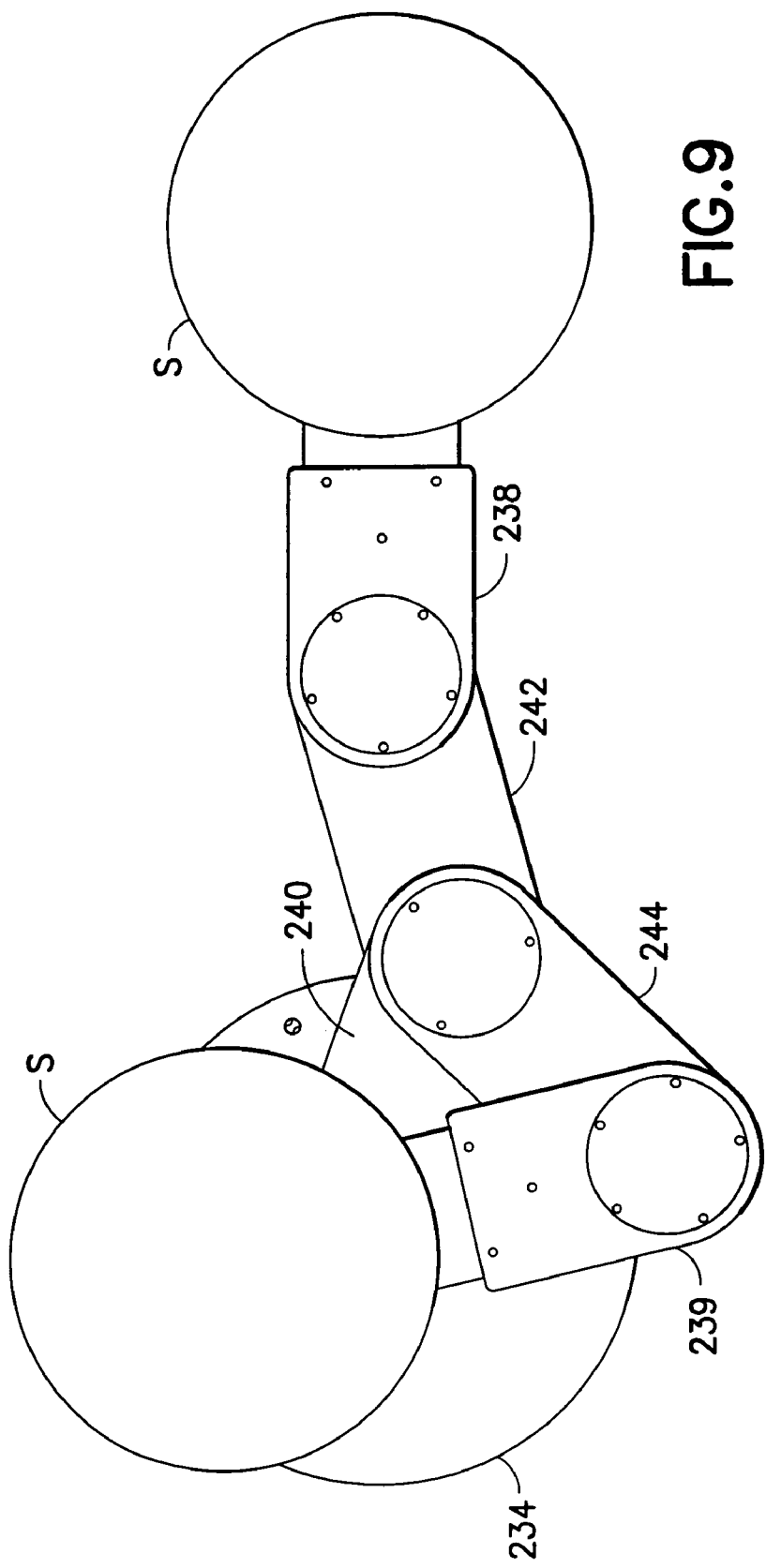

The arm assembly 236 shown on FIG. 5 may be extended and retracted using drive section 234 to substantially similar positions as those of arm assembly 36 shown in FIGS. 4A-4D. FIGS. 6-9 respectively show four positions of the movable arm assembly 236. The positions of arm assembly 236 illustrated in FIGS. 6-9 are generally similar but opposite hand to positions of arm assembly 36 shown in FIGS. 4A-4D. In FIG. 6, the arm assembly 236 is shown in a position in which both end effectors 238, 239 are retracted similar to the position of arm 36 in FIG. 4D. In FIG. 9, the arm assembly 236 is shown in a position with one end effector 238 fully extended, and the other end effector 239 retracted, generally similar but opposite hand to the position of arm assembly 36 depicted in FIG. 4A. To extend arm assembly 236 from its retracted position to an extended position as shown in FIG. 9, the controller 11 (see FIG. 1) counter-rotates the outer and inner shafts 268c, 268a (e.g. outer shaft 268c may be rotated counter-clockwise and the inner shaft 268a may be rotated clockwise) and the middle shaft 268b preferably remains stationary. Rotation of outer shaft 268c rotates upper arm link 240 as described previously. The counter-rotation of the inner shaft 268a, with respect to outer shaft 268c, counter-rotates forearm link 242 about axis Z1' with respect to the upper arm link 240. The rotation of forearm link 242 about axis Z1', brings about rotation or end effector 238 about axis Z3' in the same rotational direction as the upper link 240 (e.g. upper arm link 240 may be rotated counter-clockwise, forearm link 242 may be rotated clockwise and end effector 238 is then rotated counter-clockwise). FIGS. 7-8 illustrate intermediate positions of arm assembly 236 when extending one of the independently movable end effectors 238 from the retracted position shown in FIG. 6 to the fully extended position shown in FIG. 9. To extend arm assembly 236 from its retracted position to an extended position generally similar but opposite hand to the extended position of arm assembly 36 shown in FIG. 4B (i.e. substantially the same as in FIG. 9 except end effector 239 is extended and end effector 238 is retracted), the controller 11 counter-rotates the outer and middle shafts 268c, 268b with the inner shaft 268a being rotated in concert with the outer shaft. The counter-rotation of the middle shaft 268b rotates forearm link 244 in an opposite direction to the rotation of the upper arm link 240 (e.g. the upper arm link 240 may be rotated counter-clockwise and the forearm link 244 may be rotated clockwise). The rotation of the forearm link 244 about axis Z1' causes rotation of the end effector 239 about axis Z2' in the same direction as the upper arm link (i.e. the end effector 239 is rotated counter-clockwise here). To extend the arm assembly 236 so that both end effectors 238, 239 are extended in a position generally similar but opposite hand to the position of arm assembly 36 shown in FIG. 4C, both the inner and middle shafts 268a, 268b are rotated in the opposite direction from the rotational direction of outer shaft 268c. This causes substantially the same movements of the upper arm link 240, the forearm links 242, 244 and the corresponding end effectors 238, 239 as described above with respect to FIG. 9. Retraction of the scara arm assembly 236 is accomplished in a substantially reverse manner from that used to extend the arm.

Figure 10:
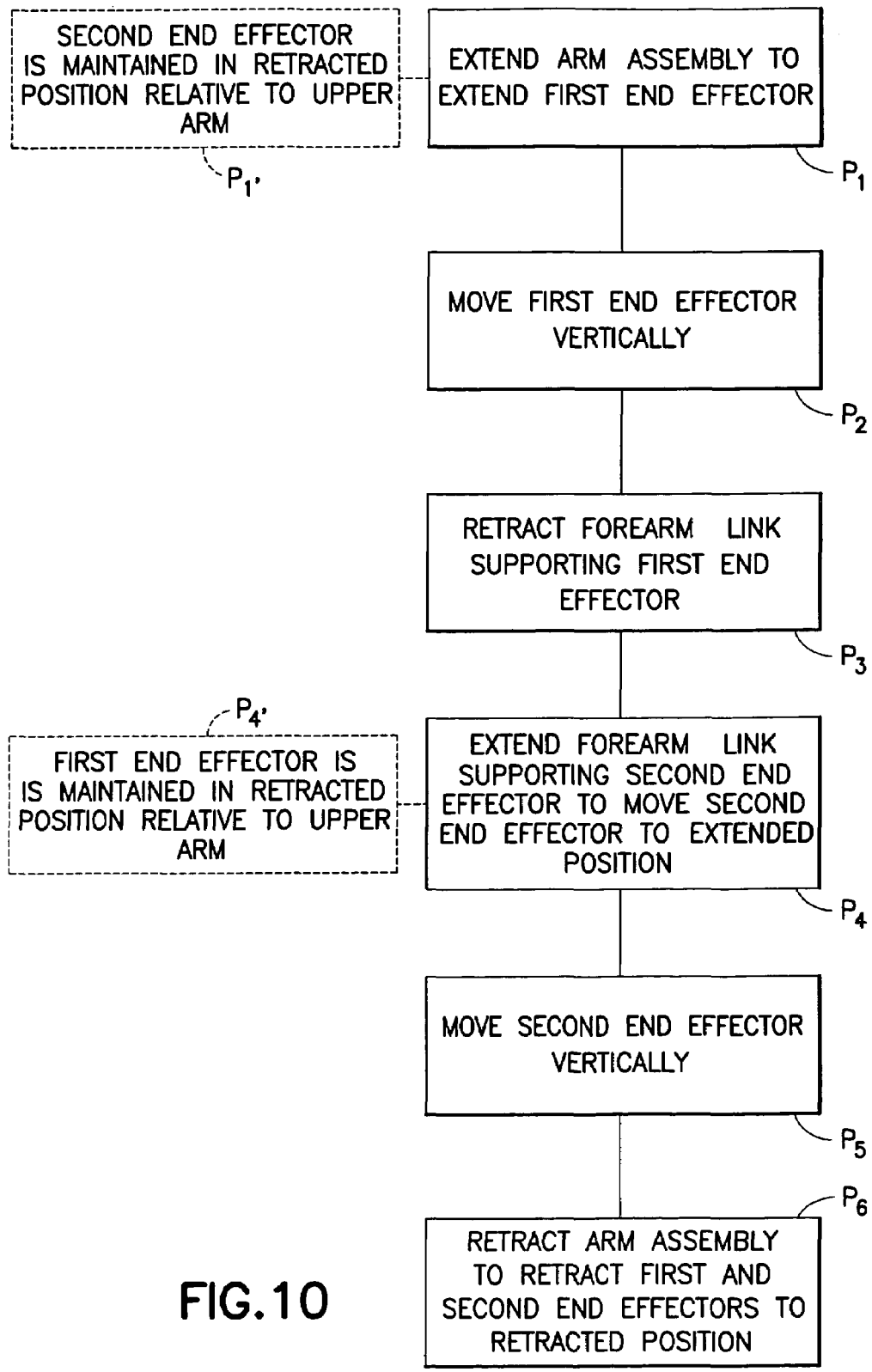
FIG. 10 is a flow chart diagrammatically depicting a method for transporting substrates with the substrate transport apparatus.

Substrates may be transported using the substrate transport apparatus 12 in accordance with the method graphically depicted in the flow chart shown in FIG. 10, and described below. The method for moving substrates S will be described in detail with reference to arm assembly 36 shown in FIGS. 2-3, 4A-4D. However, this method is substantially the same in the case the substrate transport apparatus 12 has an arm assembly 236 in accordance with the embodiment shown in FIGS. 5-9. In block P1 of FIG. 10, the arm assembly 36 may be extended as previously described to extend the first end effector 38 to a workstation (not shown), or a load lock 16, or a storage cassette 30 of the processing apparatus 10 (see FIG. 1). This position of the arm assembly 36 is depicted in FIG. 4A (see FIG. 9 for arm assembly 236). The end effector 38 may be holding a substrate S thereon for placement into the load lock 16, or cassette 30, or may be empty and being moved to pick up a substrate S from the load lock 16, or cassette 30. The outer end effector 39 is maintained in the retracted position relative to the upper arm link 40, block P1'. In block P2, the arm assembly 36 is moved vertically as desired using the vertical drive motor (not shown) to a substrate support surface in the cassette 30 or load lock 16. In the case the end effector 38 is empty, the end effector may capture substrate S in the cassette 30, or load lock 16. If the end effector 38 is holding a substrate S (similar to the position of end effector 238 shown in FIG. 9), the substrate S may be released inside the load lock 16 or cassette 30. In block P3 the end effector 38 (empty after releasing the substrate, or holding a just captured substrate thereon) is retracted by rotating the forearm link 42 inwards to the retracted position of the forearm link 42 shown in FIG. 4B. In block P4, the other end effector 39 is extended, towards the cassette 30, or load lock 16, rotating forearm link 44 outwards so that the arm assembly 36 now has the position shown in FIG. 4B. The first end effector 38 is now maintained in the retracted position relative to the upper arm link 40, block P4'. In this embodiment, the steps in blocks P4 and P3, are performed sequentially with the retraction of the end effector 38 being performed before the extension of end effector 39. In alternate embodiments, the steps in blocks P4 and P3 maybe performed substantially at the same time. In block P5 of FIG. 10, the arm assembly 36 may then be moved vertically by the vertical drive motor (not shown) to bring the extended end effector 39 towards the substrate support surface in the cassette 30, or load lock 16. The end effector 39 may then be used to capture a new substrate S or release a substrate S into the cassette, or load lock. In block P6, the arm assembly 36 is retracted fully to the position shown in FIG. 4D. (For arm assembly 236 this position is shown in FIG. 6).

The above sequence of steps may be used as desired for rapidly accomplishing any number of substrate transport procedures with the substrate transport apparatus 12 of the present invention. In one example, the transport apparatus 12 may be used to rapidly exchange substrates in the load lock 16. In that case, the load lock 16 holds a first substrate (e.g. possibly after being processed in the processing apparatus 10), the end effector 38 may be initially empty, and end effector 39 may be holding another substrate S destined for the load lock 16. Accordingly, in blocks P1-P3 end effector 38 is extended to capture and remove the substrate S in the load lock 16. Then in blocks P4-P5 end effector 39 is moved to rapidly place the substrate S held by end effector 39 in the now empty load lock 16. There is little or no delay between the time the substrate S initially in load lock 16 is removed with end effector 38, and the time the replacement substrate S is placed in the empty load lock with end effector 39. The end effector 39 holding the replacement substrate S is aligned with the load lock 16 when the first end effector 38 removes the substrate S in load lock 16. Hence, no additional time is used for aligning the end effector 39 with the load lock 16 after end effector 38 removes the substrate S in block P3 of FIG. 10, and end effector 39 places the replacement substrate in load lock in block P4 of FIG. 10. The time for completing a substrate exchange as described above with the transport apparatus of the present invention may be approximately 25% faster in comparison to substrate exchange times achieved with transport apparatus having dual scara arms, or apparatus having a single scara arm with dual not independent end effectors as in the prior art.

Figure 11:
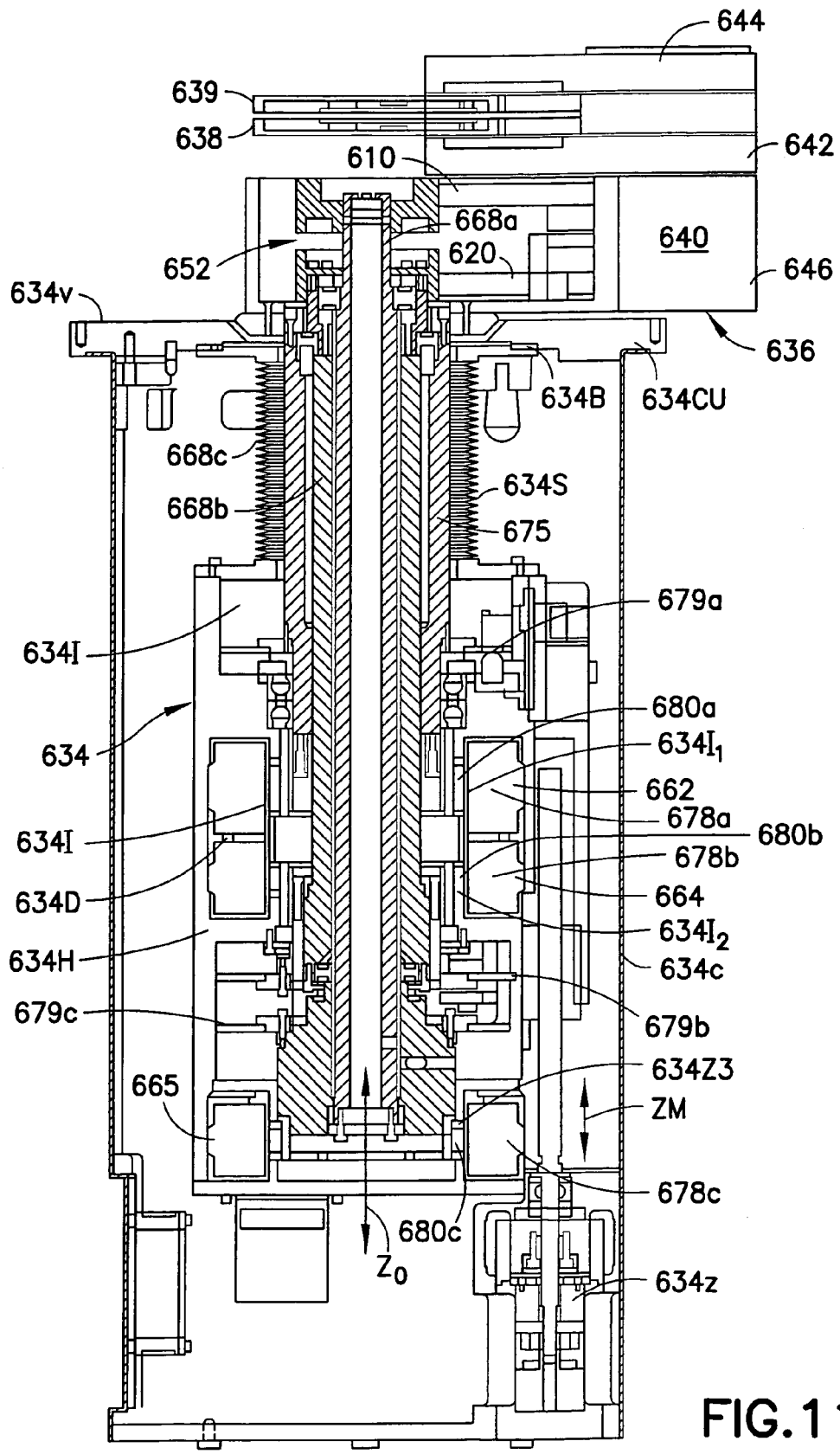
FIG. 11 is a cross-sectional elevation view of a substrate transport apparatus in accordance with another embodiment of the present invention.
Figure 12:
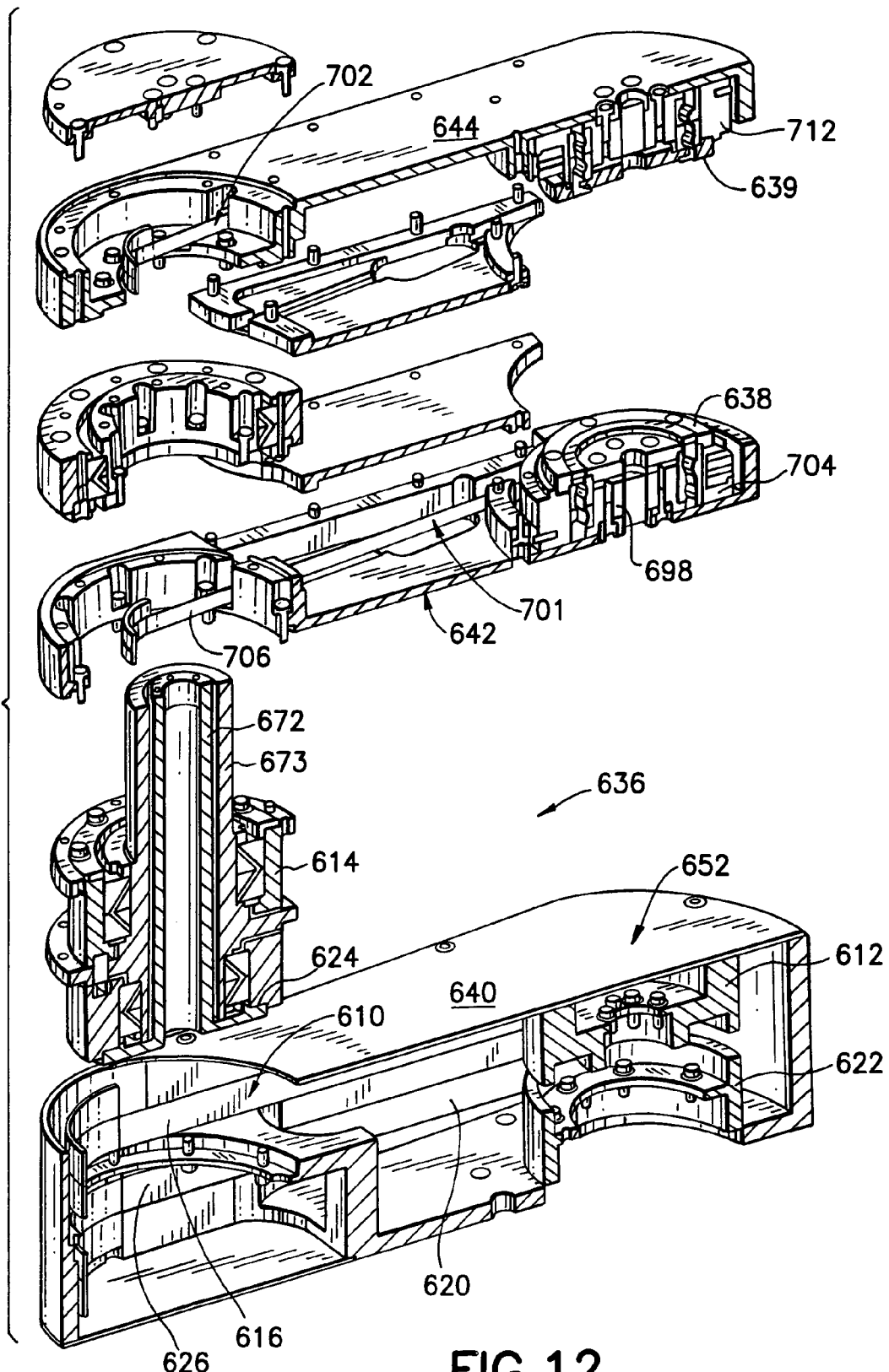
FIG. 12 is an exploded perspective view of an arm assembly of the substrate transport apparatus in FIG. 11.

Referring now to FIG. 11, there is shown a cross-sectional view of a substrate transport apparatus 10A in accordance with still another embodiment of the present invention. The apparatus 10A is substantially similar to the substrate transport apparatus described before and shown in FIGS. 5-9. Similar features are thus similarly numbered. The apparatus 10A, however, can be used in a vacuum environment as will be described in greater detail below. As with the transport apparatus described before, apparatus 10A has a drive section 634 and an arm assembly 636. The drive section 634 is connected to the arm assembly 636 so that the drive section can rotate the assembly as a unit about the shoulder joint 652 of the arm and extend the arm assembly in a manner similar to that shown in FIGS. 4A-4D. As in the embodiments described before, the arm assembly has an upper arm link 640 and two independently rotatable forearms 642, 644 each supporting an end effector 638, 639 as shown in FIG. 11. The upper arm link 640 is connected to the drive section 634 at shoulder joint 652. Both forearms 642, 644 are joined at the elbow joint 646 so that the forearms may pivot about an axis of rotation (similar to axis Z1) at the elbow joint. As seen in FIG. 11, the drive section 634 has a housing 634H and a shaft assembly 675. The housing 634H may be held in an outermost casement 634C which supports the apparatus 10A, and allows the apparatus to be installed and removed as a unit or module into a vacuum, or maybe an atmospheric, processing device. The outer casement may have cutouts or access holes formed therethrough, or in alternate embodiments, may be sealed to isolate its interior from the environment outside the casement. The casement 634C may include a suitable rectilinear drive motor 634Z to translate the drive section 634, and hence the arm assembly itself, back and forth along axis ZM shown in FIG. 11. The casement 634C has an upper section 634CU which, when the casement is mounted to a vacuum section of a substrate processing device (not shown), becomes part of the vacuum section plenum boundary 634V. As seen in FIG. 11, the housing 634H is within the outer casement. The housing has an outer portion 634O and an inner portion 634I. The shaft assembly 675 is suspended in the housing 634H. Similar to the previous embodiments, shaft assembly 675 has three shafts 668a, 668b, 668c which are arranged co-axially to rotate about axis Z0. The housing 634H also holds three motors 662, 664, 665, one to power each shaft. Each motor 662, 664, 665 has a rotor 680a, 680b, 680c and a stator 678a, 678b, 678c. As noted before, the motors may be brushless DC motors, stepper motors or any other suitable type of motor. The rotors 680a, 680b, 680c, are fixedly mounted onto the corresponding shafts 668a, 668b, 668c. The stators 678a, 678b, 678c respectively are fixedly mounted to the housing 634H. The housing may have interior members 634I1, 634I2, 634I3 which extend between the corresponding stators and rotors of the respective motors 662, 664, 665 as shown in FIG. 11. The interior members 634I1, 634I2, 634I3 isolate the inner portion 634I of the housing, in which the coaxial shaft assembly 675 and rotors 680a, 680b, 680c are located from the outer portion 634O of the housing. The inner portion of the housing communicates through bellows seal 634S with a bore 634B in portion 634 CU. Accordingly, the inner portion 634I of the housing 634H is open to the atmosphere, vacuum or otherwise, inside the processing device, and isolated from the atmosphere in the outer portion 634O of the housing. This prevents contamination from entering or being generated into the inner portion of the housing. Each shaft 668a, 668b, 668c may have position sensor 679a, 679b, 679c used by the controller to operate the motor 662, 664, 665 for each shaft. As seen in FIG. 11, the end of shaft 668c is fixedly connected (for example by mechanical fasteners or any other suitable fastening means) to the outer frame of the upper arm 646. Hence, when the shaft 668c is rotated the upper arm 646 is also rotated about axis Z0 at the shoulder. The respective ends of shafts 668b, 668a extend into the body of the upper arm 646, though in alternate embodiments the shaft ends may be located external to the upper arm. Referring also to FIG. 12, which shows an exploded view of the arm assembly 636, shafts 668b, 668a are connected by transmissions 620, 610 respectively to forearms 644, 642. Transmission 620 comprises pulley 622, belt 626, and idler 624. Pulley 622 is mounted to shaft 668b as seen in FIG. 11. Idler 624 is mounted onto shaft 672 so that the idler and shaft rotate as a unit. Belt 626 connects the pulley to the idler. Transmission 610 is similar, with a pulley 612 on shaft 668a, idler 614 fixedly connected to the forearm 642, and belt 616 connecting pulley and idler. Both idlers 624, 614 are rotatably mounted, using any suitable bearings including magnetic bearings on outer cylindrical shaft 673. Shaft 673 is fixed to the body of upper arm 640. Thus, independent rotation of the forearms 644, 642 is effected by independently rotating shafts 668b, 668a. In alternate embodiments, the transmissions independently connecting the shafts in the drive section to the individual forearms may be of any suitable kind.

Each forearm 642, 644 includes a synchronization mechanism or synchro 701, 702 which synchronizes the position of the respective end effectors 638, 639 with the movement of the supporting forearms. Each synchro 701, 702 is substantially the same, and will be described below with specific reference to synchro 701 in arm 642. The synchro has a belt 706 and idler 704. In this embodiment, the belt 706 is disposed around fixed shaft 673. In alternate embodiments, the shaft may have a suitable sized wheel, fixed on the shaft, on which the belt is placed. Idler 704 is rotatably mounted on shaft 698 fixed to the forearm 642. The end effector 638 is fixed on the idler. In this embodiment, the end effector 638 is located between the forearms 642, 644. As shown in FIGS. 4A-4D, the synchro holds the end effector 638, 639 aligned along a substantially constant radial axis when the forearm 642, 644 is extended. The synchro 702 has an idler 712 which supports end effector 639. In this embodiment, end effector 639 is also located between the forearms 642, 644 as shown in FIG. 11. This configuration has a significant advantage over conventional substrate transport devices. Rapid swap out of substrates from a given processing chamber (not shown) of the processing device is performed substantially similar to the manner described before and pictorially illustrated in the flow chart shown in FIG. 10. Moreover, the proximity of the end effectors in the Z direction to each other minimizes the desired movement of the transport apparatus in the direction indicated by arrow ZM in FIG. 11. This results in a faster pick or drop of a substrate from the transport apparatus than in conventional transports.

The present invention provides a robot having a scara arm with dual independently extendible and retractable end effectors. This allows the robot to have a smaller footprint than robots of the prior art which have for example two non-concentric scara arms each with one end effector. A smaller footprint can increase throughput because a smaller extension and retraction distance can be provided. A smaller footprint also reduces the cost per manufacturing floor space.

FIGS. 1 and 2 show the moveable arm assembly 36 with end effectors adapted to hold only singular substrates S. However, other types of end effectors could be used. For example, one forearm (such as arm 44 in FIG. 2 for example) could have a single substrate end effector and a multiple substrate end effector for holding multiple substrates may depend from the other forearm (e.g. 42 in FIG. 2). The present invention could use a transfer method such as disclosed in U.S. patent application Ser. No. 09/044,820 which is hereby incorporated by reference in its entirety. The movable arm assembly could also have a substrate aligner thereon, use gravity holding only, vacuum holding or a combined gravity/vacuum holding, such as disclosed in U.S. patent application Ser. No. 08/889,526 which is also hereby incorporated by reference in its entirety.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate transport apparatus, comprising:
a first drive section;
an upper arm rotatably connected to the drive section at a first end of the upper arm for rotating the upper arm about an axis of rotation of the first drive section;
a first forearm pivotably connected to the upper arm for pivoting relative to the upper arm on an axis displaced from said drive section axis, the first forearm having a first end effector depending therefrom;
a second forearm pivotably connected to the upper arm for pivoting relative to the upper arm on said displaced axis, the second forearm having a second end effector depending therefrom; and
a second drive section comprising a first motor drive mechanism, and a second motor drive mechanism mounted on said upper arm, the first motor drive mechanism being connected to the first forearm for pivoting the first forearm relative to the upper arm on said displaced axis, and the second motor drive mechanism being connected to the second forearm for pivoting the second forearm relative to the upper arm on said displaced axis.

2. The substrate transport apparatus in accordance with claim 1, wherein the first forearm and the second forearm are connected to a second end of the upper arm opposite the first end.

3. The substrate transport apparatus in accordance with claim 1, wherein the first forearm and the second forearm are each pivoted independently relative to the upper arm.

4. The substrate transport apparatus in accordance with claim 1, wherein the upper arm rotates about the axis of rotation of the drive section between a retracted position and an extended position of the upper arm, the first forearm pivots relative to the upper arm from a retracted position to an extended position of the first forearm, and the second forearm pivots relative to the upper arm from a retracted position to an extended position of the second forearm, and wherein when the upper arm is rotated to its extended position, the first forearm is rotated to its extended position and the second forearm stays in its retracted position.

5. A substrate transport apparatus, according to claim 1, wherein said motor drive mechanisms are mounted on said upper arm by a support system, said support system comprising:
   a first hollow support shaft mounted for rotation on said upper arm, said first forearm fixed to said first hollow support shaft for rotation therewith; and
   a second support shaft mounted coaxially within said first hollow support shaft, said second support shaft being fixed relative to said upper arm;
   wherein said second motor drive mechanism is mounted for rotation on said second support shaft and further wherein said second forearm is mounted for rotation on said second support shaft and fixed to said second motor drive mechanism for rotation therewith.

6. A substrate transport apparatus, according to claim 5, wherein said first and second end effectors are mounted for rotation on said first and second forearms respectively and are operatively connected to first and second synchronizing links, said synchronizing links being fixed to said second support shaft to cause rotation of said end effectors in opposition to rotation of said first and second forearms.

7. The substrate transport apparatus in accordance with claim 1, wherein the first motor drive mechanism of the second drive section is directly connected to the first forearm, and wherein the second motor drive mechanism of the second drive section is directly connected to the second forearm.

8. A substrate transport apparatus, comprising:
   a drive section; and
   a scara arm rotatably connected at a shoulder joint to the drive section for rotating the scara arm about an axis of rotation at the shoulder joint of the scara arm;
   wherein the scara arm has a number of end effectors connected to a common upper arm of the scara arm by link supports so that at least one of the end effectors depends from a first link support, and another one of the end effectors depends from a second link support without depending from the first link support, the first and second link supports each being independently pivotable, relative to each other, on a common axis at an elbow of the scara arm; and
   wherein the scara arm is capable of extending and retracting for extending and retracting the at least one of the end effectors relative to the shoulder of the scara arm independent from extension and retraction of the another one of the end effectors, and the scara arm having a first extended position wherein the at least one of the end effectors of the scara arm is extended; and
   wherein the drive section has at least one motor drive mechanism, the at least one motor drive mechanism being operably associated with the at least one of the end effectors to cause said extending and retracting of said at least one end effector.

9. The substrate transport apparatus in accordance with claim 8, wherein when the scara arm is in the first extended position a second end effector of the number of end effectors of the scara arm is not extended.

10. The substrate transport apparatus in accordance with claim 9, wherein the scara arm has a second extended position wherein both the at least one end effector and the second end effector are extended.

11. The substrate transport apparatus in accordance with claim 8, wherein the scara arm has two end effectors.

12. The substrate transport apparatus in accordance with claim 8, wherein the drive section has a number of motor drive mechanisms for moving the end effectors of the scara arm, the number of motor drive mechanisms of the drive section corresponding to the number of end effectors of the scara arm.

13. The substrate transport apparatus in accordance with claim 8, wherein the common upper arm extends between the shoulder joint and the elbow joint of the scara arm, and the first and second link supports are pivotably connected to the upper arm at the elbow joint, each of the first and second link supports having a corresponding one of the end effectors depending therefrom.

14. The substrate transport apparatus in accordance with claim 13, wherein each of the link supports is operably connected to a corresponding motor drive mechanism in the drive section for independently pivoting each link support about the elbow joint of the scara arm when the end effector on the link support is being extended or retracted.

15. The substrate transport apparatus in accordance with claim 13, wherein the upper arm has said motor drive mechanisms mounted thereon, each of the motor drive mechanisms on the upper arm being operably connected to a corresponding one of the link supports for independently pivoting each link support about the elbow joint of the scara arm when the end effector on the forearm is being extended or retracted.

16. The substrate transport apparatus in accordance with claim 8, wherein the at least one motor drive mechanism is operably associated with the at least one end effector via a first transmission member, and wherein the drive section further comprises another motor drive mechanism, operably associated with the another one of the end effectors via a second transmission member, the second transmission member being concentric with the first transmission member.

17. The substrate transport apparatus in accordance with claim 16, wherein the first and second transmission members are shafts that are co-axial with each other.

18. The substrate transport apparatus in accordance with claim 17, wherein the another drive mechanism is capable of rotating the second transmission member to cause extension and retraction of the another one of the end effectors.

19. The substrate transport apparatus in accordance with claim 8, wherein the at least one motor drive mechanism is mounted on the scara arm.

* * * * *